United States Patent [19]

Luich

[11] Patent Number: 5,039,892

[45] Date of Patent: Aug. 13, 1991

[54] HIGH SPEED DATA/TRI-STATE SENSE CIRCUIT

[75] Inventor: Thomas M. Luich, Campbell, Calif.

[73] Assignee: National Semiconductor Corporation, Santa Clara, Calif.

[21] Appl. No.: 534,756

[22] Filed: Jun. 7, 1990

[51] Int. Cl.⁵ .............................................. H03K 19/00
[52] U.S. Cl. .................... 307/530; 307/473; 307/443; 307/456
[58] Field of Search .............. 307/443, 456, 473, 585, 307/530

[56] References Cited

U.S. PATENT DOCUMENTS

| | | | |
|---|---|---|---|
| 4,321,490 | 3/1982 | Bechdolt | 307/456 |
| 4,454,432 | 6/1984 | Wood | 307/473 |
| 4,517,475 | 5/1985 | Petty | 307/272 |
| 4,591,741 | 5/1986 | Cooper | 307/456 |
| 4,607,175 | 8/1986 | Lee et al. | 307/473 |
| 4,745,308 | 5/1988 | Neely | 307/473 |
| 4,859,882 | 8/1989 | Matsumoto et al. | 307/585 |
| 4,871,926 | 10/1989 | Neely et al. | 307/473 |
| 4,973,862 | 11/1990 | Luich et al. | 307/456 |

FOREIGN PATENT DOCUMENTS 58-220525(A) 12/1983 Japan .
61-10315(A) 1/1986 Japan .

Primary Examiner—Stanley D. Miller
Assistant Examiner—Scott A. Ouellette
Attorney, Agent, or Firm—Steven F. Caserza; Lee Patch

[57] ABSTRACT

In accordance with teachings of this invention a novel sense amplifier is provided. The sense amplifier includes an enable circuit which receives an enable input signal. This enable circuit includes a constant current source which consumes a small amount of power. The enable circuit provides an output signal which serves to disable the output pull up and pull down transistors of the sense amplifier, thereby providing a high impedance output signal. At the same time, the disabling output signal from the enable circuitry powers down the read circuitry, thereby minimizing power consumption.

19 Claims, 3 Drawing Sheets

HIGH SPEED DATA/TRI-STATE SENSE CIRCUIT

INTRODUCTION

1. Background

This invention pertains to electronic circuits, and more particularly to a sense amplifier for sensing low level signals and providing higher level output signals. The teachings of this invention are particularly useful in sense amplifiers for use with programmable logic devices.

2. Description of the Prior Art

FIG. 1 is a schematic diagram of a typical prior art sense amplifier. The operation of the prior art circuit 100 of FIG. 1 is now described with reference to Table 1.

Sense amplifier 100 includes two input terminals, data input terminal 126 which receives data to be sensed, and enable input terminal 105 which receives a signal defining when the output of sense amplifier 100 is to be enabled. Sense amplifier 100 includes output terminal 135 which provides an output signal which is related to the data signal received on data input terminal 126 when output terminal 135 is enabled, and which is a high impedance output signal when output terminal 135 is disabled. As shown in FIG. 1, sense amplifier 100 includes enable input stage 101a, enable sense amplifier stage 102, data input stage 101b, data sense amplifier stage 103, and output stage 104. In data sense amplifier 103 transistor 119 has its collector connected to its base, and thus a reference current IREF flows from a positive voltage source through resistor 117, diode 118, and transistor 119 to ground. This establishes a bias voltage on the base of transistor 121 such that transistor 121 tends to mirror the collector current flowing through transistor 119.

With a logical zero data input signal applied to data input terminal 126, transistor 124 is turned off, and thus does not supply current through diode 123 to the collector of transistor 121. Since transistor 124 supplies no current to the collector of transistor 121, transistor 121 draws its current from transistor 122, which turns on, thus causing node N1 within output stage 104 to be low. With node N1 low, phase splitter transistor 129 is turned off, causing node N2 to be high. This in turn causes output pull-up transistors 131 and 132 to turn on, connecting output terminal 135 to the positive voltage supply, providing a high output signal. Simultaneously, with phase splitter transistor 129 turned off, the emitter of transistor 129 is pulled low by resistor 130, causing output pull down transistor 134 to be turned off.

With a logical one data input signal applied to data input terminal 126, transistor 124 is turned on, and supplies current through diode 123 to the collector of transistor 121. Since transistor 124 supplies current to the collector of transistor 121, transistor 121 does not draw current from transistor 122, which turns off, thus causing node N1 within output stage 104 to be high. With node N1 high, phase splitter transistor 129 is turned on, causing node N2 to be low. This in turn causes output pull-up transistors 131 and 132 to turn off. Simultaneously, with phase splitter transistor 129 turned on, output pull down transistor 134 is turned on, pulling output terminal 135 low.

The above discussion does not consider the effect of enable sense amplifier circuit 102, which operates as follows. Transistor 116 has its base connected to its collector, forming a reference current path from a positive supply voltage, through resistor 114, diode 115, and transistor 116 to ground. This provides a base bias to transistor 110 causing transistor 110 to mirror the collector current flowing through transistor 116. With a logical one enable signal applied to enable input terminal 105, transistor 107 turns on, supplying current to the collector of transistor 110. This places a high voltage on the emitters of transistors 109 and 111, causing transistors 109 and 111 to be turned off. With transistor 109 turned off, node N2 of output stage 104 is high, unless pulled down by phase splitter transistor 129. Similarly, with transistor 111 off, node N1 of output stage 104 is pulled high by resistor 128, unless node N1 is pulled low by transistor 122 of data sense amplifier 103. At this time, enable sense amplifier 102 enables output stage 104 to provide an output signal on output signal 135 which is dependent on the state of transistor 122, which in turn is dependent on the state of the data input signal applied to input terminal 126.

Conversely, a logical zero enable signal applied to enable input terminal 105 causes transistor 107 to turn off. Transistor 110 pulls the emitters of transistors 109 and 111 low, causing transistors 109 and 111 to be turned on. With transistor 109 turned on, node N2 of output stage 104 is pulled low, regardless of the state of the phase splitter transistor 129. Similarly, with transistor 111 on, node N1 of output stage 104 is pulled low, regardless of the state of transistor 122 of data sense amplifier 103. At this time, output stage 104 is disabled by enable sense amplifier 102.

While the prior art circuit of FIG. 1 operates to correctly sense the state of the data input signal applied to data input terminal 126, and provides a high impedance signal in response to a high enable signal applied to enable terminal 105, it has several disadvantages. First, it consumes a relatively large amount of power due to the constant current paths which include transistors 110, 116, 119, and 121. In a typical device, transistor 110 will always sink approximately 3.5 to 4 milliamps, transistor 116 will always sink about 1 milliamp, transistor 121 about 1.5 milliamp, and transistor 119 about 0.3 milliamps. In a typical device, a number of such sense amplifier circuits are required, thereby greatly increasing the current consumption. For example, in a device which includes 8 outputs a minimum 50 milliamps of current is constantly consumed. No current is saved in either data sense amplifier 103 or enable sense amplifier 102 when enable sense amplifier 102 is disabled.

Furthermore, there are two nodes in output stage 104, i.e. nodes N1 and N2, which are critical with respect to the switching speed of the circuit. Node N1 has associated with it primarily the collector-base capacitance of transistors 111, 122, and 129, as well as the collector to substrate capacitance of transistors 111 and 122, since capacitances of other components connected to node N1 are negligible. Similarly, node N2 has associated with it primarily the base-collector capacitances of transistors 109 and 131 plus the collector to substrate capacitance of transistor 109. Thus, unfortunately the circuit of FIG. 1 provides that the two critical nodes N1 and N2 of output stage 104 have associated therewith a relatively large capacitance, thereby causing nodes N1 and N2 to react relatively slowly to changes in voltage applied thereto.

FIG. 2 is a schematic diagram of another prior art sense amplifier 200, and its operation is now described with reference to Table 2. Sense amplifier 200 includes enable input circuit 201a, data input circuit 201b, enable sense amplifier circuit 202, data sense amplifier circuit 203 and output circuit 204. Circuit 200 reduces the amount of current required by utilizing current amplification in each circuit 202 and 203. Referring to enable sense amplifier 202, current source 240 typically sources only approximately 0.04 milliamps. This current is amplified by transistor 244 in order to sink approximately 0.4 milliamps of current supplied by resistor 243. When the current supplied by resistor 243 is not being sunk by transistor 244, it is available as base drive to transistor 245. Transistor 245 sinks approximately 3.5 to 4 milliamps in order to control node N2 of output stage 204. With a logical zero enable input signal applied to enable input terminal 205, transistor 207 is off, and thus does not supply current to the cathode of diode 241. Thus, current source 240 obtains its current through resistor 242 and diode 241. This causes the base of transistor 244 to be pulled low, turning off transistor 244 and allowing resistor 243 to pull up the base of transistor 245 in order to turn on transistor 245. With transistor 245 turned on, node N2 is pulled low, disabling output stage 204.

Conversely, with a logical one enable input signal applied to terminal 205, transistor 207 is turned on Transistor 207 supplies approximately 0.04 milliamps to current source 240. This causes diode 241 to cease conduction, thereby causing resistor 242 to supply base drive to transistor 244. This turns on transistor 244, pulling the base of transistor 245 low and turning off transistor 245, allowing node N2 of output stage 204 to be controlled by the state of phase splitter transistor 229, which in turn is controlled by the state of the data input signal applied to data input terminal 226.

The operation of data input stage 201b is similar to that of enable input stage 201a, and the operation of data sense amplifier 203 is similar to the operation of enable sense amplifier 202. The operation of output stage 204 is quite similar to the operation of output stage 104 (FIG. 1) and thus will not be described again in detail.

A key feature of the sense amplifier of FIG. 2 is that, when enabled, enable sense amplifier circuit 202 sinks a relatively small amount of current, i.e., the 0.04 milliamps sunk by current source 240 plus approximately 0.04 milliamps base current supplied to transistor 244 by resistor 242, plus the approximately 0.4 milliamps collector current of transistor 244, or a total of approximately 0.48 milliamps. This is in contrast to the circuit of FIG. 1, which requires that enable sense amplifier 102 always draw at least approximately 4.5 milliamps (via transistors 110 and 116) through its current source, plus additional related currents. When disabled, enable sense amplifier 202 consumes the 0.04 milliamp from resistor 242 through current source 240, approximately 0.4 milliamp base current applied to transistor 245 through resistor 243, and approximately 4 milliamps through transistor 245, or a total of approximately 4.404 milliamps. This is on the order of the current which is always consumed by the enable sense amplifier portion of the prior art sense amplifier of FIG. 1, when enabled. The same current figures apply with regard to the data sense amplifier portion 203 of the circuit of FIG. 2.

However, this saving in current in the prior art circuit of FIG. 2 as compared with the prior art circuit of FIG. 1 is obtained at the expense of speed. The prior art enable sense amplifier circuit 102 of FIG. 1 requires no inversions of the signal applied to it in order to control nodes N1 and N2 of output stage 104, with transistors 111 and 109 operating in the higher speed cascode mode, which turn on and off in response to changes in emitter signals rather than base signals. However, the prior art circuit of FIG. 2 requires two such inversions to control node N2 of output stage 204, i.e. the inversion provided by transistor 244 and the inversion provided by transistor 245. The same comments hold true for data sense amplifier 203. This results in a decrease in switching speed. Furthermore, critical node N1 has associated therewith the base-collector capacitances of transistors 255 and 229 plus the collector to substrate capacitance of transistor 255. Critical node N2 has associated therewith the base-collector capacitances of transistors 245 and 231 plus the collector to substrate capacitance of transistor 245. Thus, a relatively large amount of capacitance is associated with the critical nodes N1 and N2 in the prior art circuit of FIG. 2, thus causing it to switch rather slowly.

Accordingly, there remains a need for providing a sense amplifier which consumes low power, but which provides high switching speed.

SUMMARY

In accordance with teachings of this invention a novel sense amplifier is provided. The sense amplifier includes an enable circuit which receives an enable input signal. This enable circuit includes a constant current source which consumes a small amount of power. The enable circuit provides an output signal which serves to disable the output pull up and pull down transistors of the sense amplifier, thereby providing a high impedance output signal. At the same time, the disabling output signal from the enable circuitry powers down the read circuitry, thereby minimizing power consumption.

DETAILED DESCRIPTION

Figure 1:
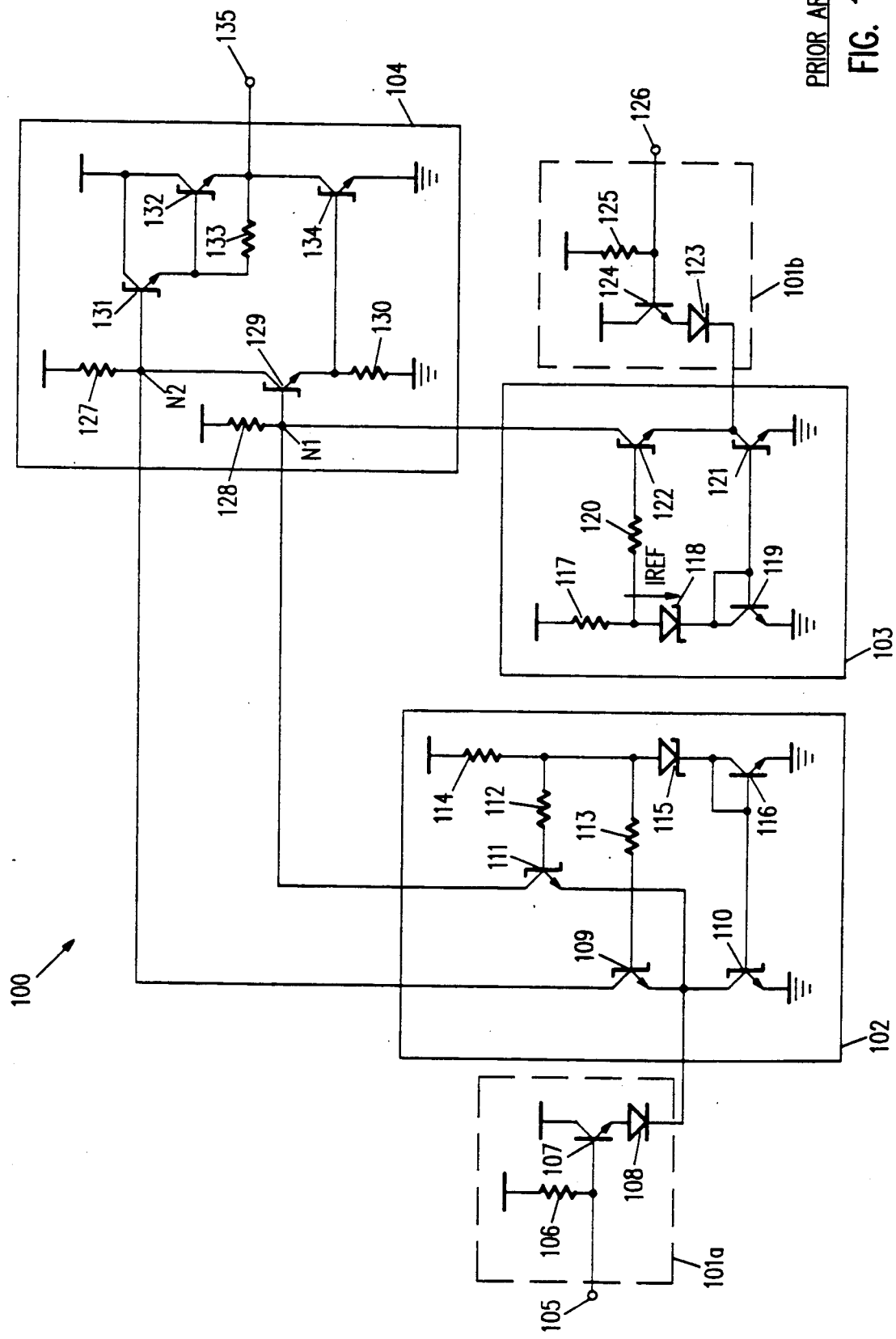
FIG. 1 is a schematic diagram of a prior art sense amplifier.
Figure 2:
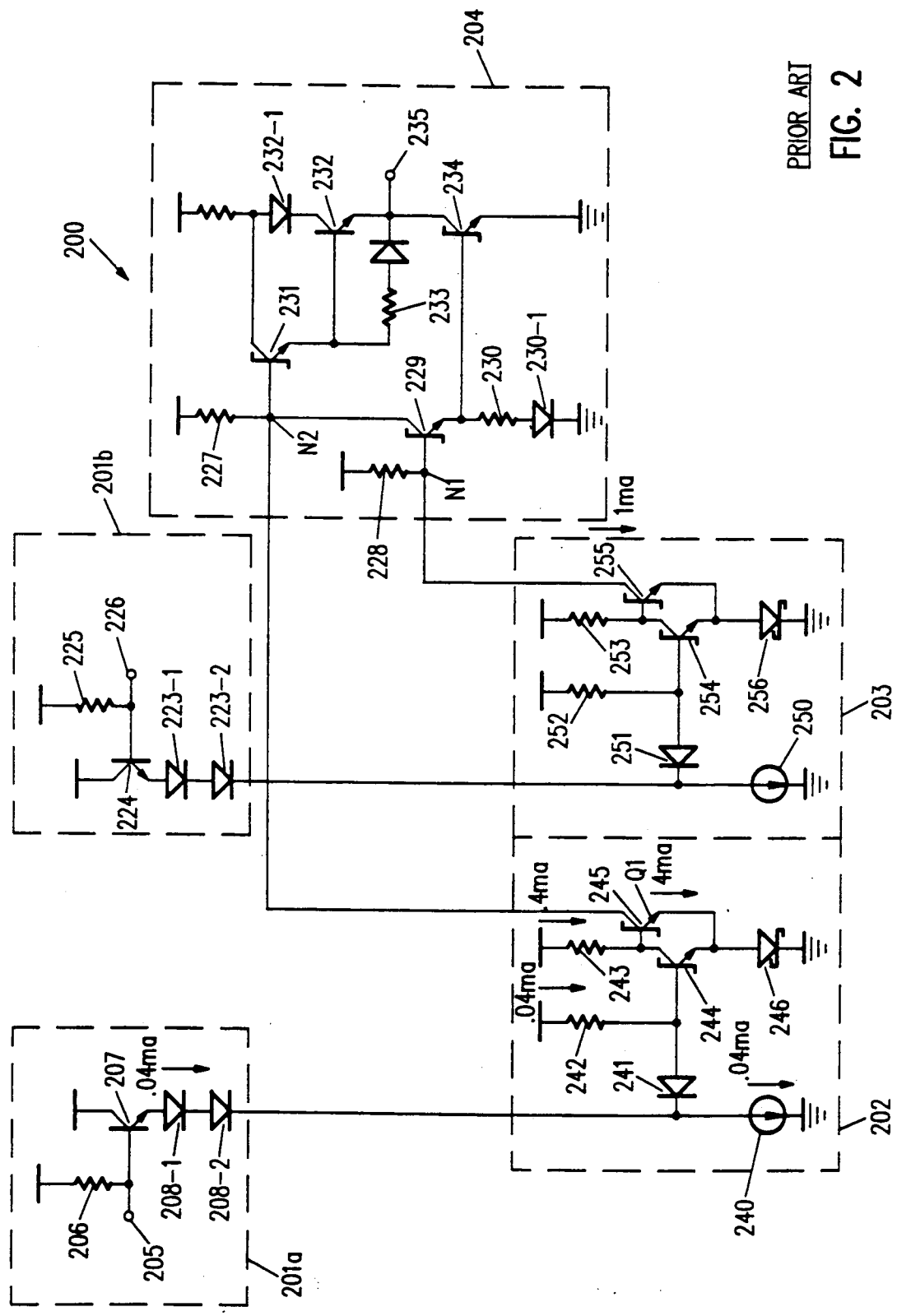
FIG. 2 is a schematic diagram of another prior art sense amplifier.
Figure 3:
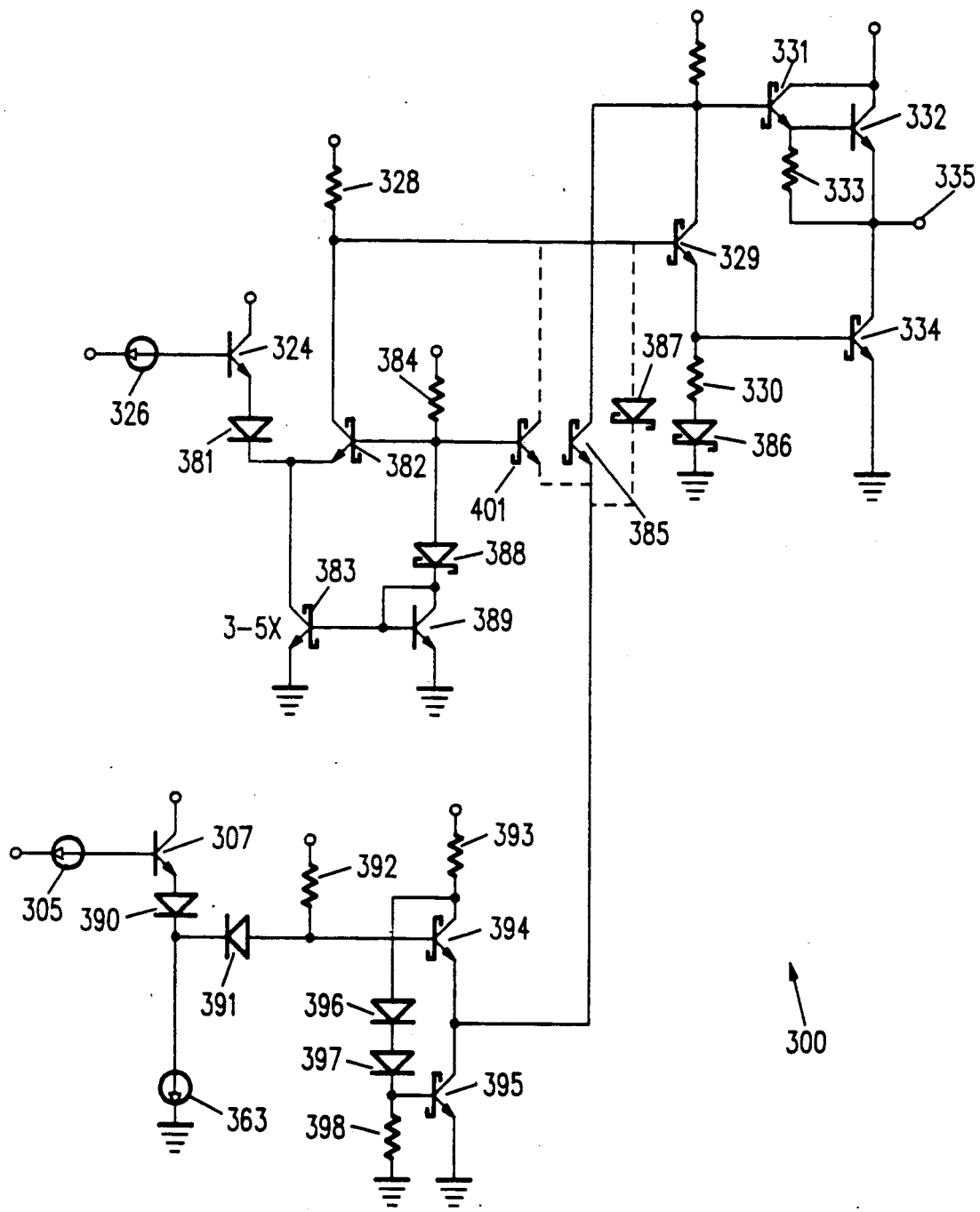
FIG. 3 is a schematic diagram of one embodiment of a sense amplifier constructed in accordance with the teachings of this invention.

FIG. 3 is a schematic diagram of one embodiment of a sense amplifier 300 constructed in accordance with the teachings of this invention, which is now described with reference to Table 3. Sense amplifier 300 includes data input terminal 326 for receiving an input data signal. Sense amplifier 300 also includes enable input terminal 305 which receives an enable input signal. Output terminal 335 provides an output signal in response to the data input signal applied to data input terminal 326 when the output is enabled by the enable signal applied to enable input terminal 305.

With a logical zero enable input signal applied to enable input terminal 305, transistor 307 is turned off, and thus current source 363 pulls down the base of transistor 394. Thus, transistor 394 is turned off, and base drive is provided through diodes 396 and 397 to transistor 395. Transistor 395 is turned on, pulling down the emitter of transistor 385. With the emitter of transistor 385 pulled low, transistor 385 turns on, pulling down the base of transistor 331 and the collector of transistor 329, insuring that both remain off. This insures that output transistors 332 and 334 both remain off, providing a high impedance output signal on output terminal 335.

Current source 363 consumes only approximately 400 microamps, resistor 392 draws approximately 200 to 400 microamps, and transistor 395 draws only approximately 3 milliamps during this disabled mode of operation, which is sufficient to pull down the emitter of transistor 385. Smaller amounts of current can be drawn by current source 363 and resistor 392 as this stage has high current gain, but in this embodiment such current levels are preferred in order to maintain relatively fast RC time constants for fast switching speed. Also, with transistor 385 turned on, transistors 389 and 383 are turned off, powering off the data input circuitry, which normally draws approximately 2 milliamps. The switching of transistor 385 causes transistors 329 and 331 to switch substantially concurrently with the switching of transistors 389 and 383. In one embodiment, this action occurs substantially simultaneously, although in various embodiments various delays between the switching of transistors 329 and 331, and 389 and 383 may be tolerable or desirable.

Conversely, with a logical one enable signal applied to terminal 305, transistor 307 is turned on, and supplies the current sunk by current source 363, thereby allowing resistor 392 to provide base drive to transistor 394, turning it on. This lowers the collector voltage of transistor 394, reducing base drive to transistor 395, turning it off to a significantly low current level which, neglecting the base drive of transistor 394, is equal to $$I(395)_{off} = [(V_{cc} - V_{be}(395) - 2V_D/R_{393} - [-V_{be}(395)/R_{398}];$$

| where: | $I(395)_{off} =$ | the current flow through transistor 395 when turned off; |
|---|---|---|
| | $V_{be}(395) =$ | the base-emitter voltage of transistor 395; |
| | $V_D =$ | the forward bias voltage of diodes 396 and 397; |
| | $R_{393} =$ | the resistance of resistor 393; and |
| | $R_{398} =$ | the resistance of resistor 398 |

Utilizing appropriate fabrication techniques and resistor values, the current consumed by resistor 393 is on the order of 1 to 2 milliamps, and allows transistor 395 to sink on the order of 20 to 40 milliamps.

Transistor 394 supplies a high voltage to the emitter of transistor 385, preventing transistor 385 from turning on. With sense amplifier 300 enabled by the presence of a logical one enable signal on terminal 305, the output signal provided on output terminal 335 is dependent on the state of the data input signal applied to input terminal 326. With a logical zero data input signal applied to data input terminal 326, transistor 324 is off, and transistor 382 turns on in order to provide current to current mirror transistor 383 which mirrors the current from current source transistor 389. In one embodiment of this invention, transistor 383 is sized to have approximately 3 to 5 times the current carrying capability of transistor 389, thereby allowing current multiplication. With transistor 382 turned on, the base of transistor 385 is pulled low, thereby turning off transistor 385. Furthermore, with transistor 382 turned on, the base of phase splitter transistor 329 is pulled low, causing phase splitter transistor 329 to be turned off. With phase splitter transistor 329 turned off, base drive is not provided to output pull down transistor 334, and thus transistor 334 is turned off. Similarly, with phase splitter transistor 329 turned off, the base of transistor 331 is pulled high by resistor 327, and output pull up transistors 331 and 332 turn on thereby providing a logical one output signal on output terminal 335.

Conversely, with a logical one data input signal applied to data input terminal 326, transistor 324 turns on, providing the current needed by current mirror transistor 383. This causes transistor 382 to turn off. This causes the base of phase splitter transistor 329 to be pulled high and phase splitter transistor 329 is turned on. With phase splitter transistor 329 turned on, base drive is provided to turn on output pull down transistor 334, thereby providing a logical zero output signal on the output terminal 335. Similarly, with transistor 329 turned on, the base of transistor 331 is pulled low, and output pull up transistors 331 and 332 are turned off.

In one embodiment of this invention, optional diode 387 is included in order to help pull down the base of phase splitter transistor 329. Without diode 387, when transistor 395 is turned on the base of phase splitter transistor 329 is pulled to a level equal to $$V_{sat}(395) + V_{sat}(385) + V_{Sch}(329),$$

| where | $V_{sat}(395) =$ | the saturation voltage of transistor 395; |
|---|---|---|
| | $V_{sat}(385) =$ | the saturation voltage of transistor 385; and |
| | $V_{Sch}(329) =$ | the Schottky collector-base voltage of Schottky transistor 329. |

However, with optional diode 387, the base of phase splitter transistor 329 is pulled to a lower level when transistor 395 is turned on:

$$V_{sat}(395) + V_{Sch}(387), \text{ where}$$

| $V_{Sch}(387) =$ | the forward biased voltage drop across Schottky diode 387. |
|---|---|

In an alternative embodiment, optional transistor 401 is used for a similar purpose. In this embodiment, the base of phase splitter transistor 329 is pulled lower than in the embodiment which uses optional diode 387, i.e. to a level equal to $$V_{sat}(395) + V_{sat}(401), \text{ where}$$

| $V_{sat}(401) =$ | the saturation voltage of optional transistor 401. |
|---|---|

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

TABLE 3

| Data Input Signal (Term. 326) | 383 and 389 | 324 | 382 | Enable Input Signal (Term. 305) | 307 and 394 | 395 | 385 | 329 | 334 | 331 and 332 | Output Signal (Term. 335) |
|---|---|---|---|---|---|---|---|---|---|---|---|
| 0 | off | off | off | 0 | off | on | on | off | off | off | High Z |
| 1 | off | on | off | 0 | off | on | on | off | off | off | High Z |
| 0 | on | off | on | 1 | on | on slightly | off | off | off | on | 1 |
| 1 | on | on | off | 1 | on | on slightly | off | on | on | off | 0 |

TABLE 2

| Data Input Signal (Term. 226) | 224 | 254 | 255 | N1 | Enable Input Signal (Term. 205) | 207 | 244 | 245 | N2 | 229 and 234 | 231 and 232 | Output Signal (Term. 135) |
|---|---|---|---|---|---|---|---|---|---|---|---|---|
| 0 | off | off | on | low | 0 | off | off | on | low | off | off | High Z |
| 1 | on | on | off | low | 0 | off | off | on | low | off | off | High Z |
| 0 | off | off | on | low | 1 | on | on | off | high | off | on | 1 |
| 1 | on | on | off | high | 1 | on | on | off | low | on | off | 0 |

TABLE 1

| Data Input Signal (Terminal 126) | 124 | 122 | N1 | Enable Input Signal (Terminal 105) | 107 | 109 and 111 | N1 | N2 | 129 and 134 | 131 and 132 | Output Signal (Terminal 135) |
|---|---|---|---|---|---|---|---|---|---|---|---|
| 0 | off | on | low | 0 | off | on | low | low | off | off | High Z |
| 1 | on | off | — | 0 | off | on | low | low | off | off | High Z |
| 0 | off | on | low | 1 | on | off | low | high | off | on | 1 |
| 1 | on | off | high | 1 | on | off | high | low due to 129 | on | off | 0 |

What is claimed is:

1. A circuit comprising:
   a first supply terminal for receiving a first supply voltage;
   a second supply terminal for receiving a second supply voltage;
   a data input terminal for receiving a data input signal;
   an output terminal for providing an output signal in response to said data input signal when said output terminal is enabled;
   pull up means having a first current handling terminal coupled to said first supply terminal, a second current handling terminal coupled to said output terminal, and a control terminal;
   pull down means having a first current handling terminal coupled to said output terminal, a second current handling terminal coupled to said second supply terminal, and a control terminal;
   an enable input lead for receiving an enable signal having a first state when said output terminal is to be enabled and a second state when said output terminal is to be disabled;
   a data input circuit comprising:
      a current source; and
      an input transistor having a collector coupled to said first supply voltage, an emitter coupled to said current source, and a base coupled to said data input terminal;
   a phase splitter transistor for applying a first control signal to said control terminal of said pull up means and a second control signal to said control terminal of said pull down means, said phase splitter transistor comprising:
      a collector coupled to said control terminal of said pull up means;
      a base coupled to said data input terminal; and
      an emitter coupled to said control terminal of said pull down means; and
   means responsive to said enable signal which serves to pull down said collector of said phase splitter transistor, thereby disabling said pull up means and said pull down means, and disable said current source of said data input circuit, thereby disabling said data input circuit and conserving power when said output terminal is disabled.

2. A circuit as in claim 1 wherein said means responsive to said enable signal comprises a control transistor having a collector coupled to said collector of said phase splitter transistor, a base coupled to control said current source of said data input circuit, and an emitter responsive to said enable input signal.

3. A circuit as in claim 2 which further comprises an enable input circuit comprising:
   a pull up means coupled to said emitter of said control transistor;
   a pull down means coupled to said emitter of said control transistor;
   a current source;
   a transistor for coupling said enable input lead to said current source;
   means for controlling said pull up means in response to said enable input signal; and
   means for controlling said pull down means in response to the operation of said pull up means.

4. A circuit as in claim 3 wherein said means for controlling said pull up means comprises a transistor, said pull down means comprises a transistor, and said means for controlling said pull down means comprises means for coupling the collector of said pull up transistor to the base of said pull down transistor.

5. A method for operating a circuit comprising a data input terminal coupled to a data input circuit including a current source, an enable input terminal, and an output terminal, said method comprising the step of:

upon receipt of a disable input signal on said enable input terminal, disabling said current source of said data input circuit and with placing a high impedance on said output terminal.

6. A method as in claim 5 wherein said circuit further comprises an output pull up transistor and an output pull down transistor, and a phase splitter transistor for controlling the operation of said output pull up and output pull down transistors in response to input signals received on said data input lead and said enable input lead, wherein said step of placing a high impedance on said output terminal comprises the step of disabling said phase splitter transistor such that said output pull up and output pull down transistors are turned off.

7. A method as in claim 6 wherein said current source of said data input circuit comprises a load device and a current source transistor for mirroring the current in said load device, wherein said step of disabling said current source comprises the step of reducing the current through said load device.

8. A method as in claim 7 wherein said step of reducing the current through said load device comprises the step of reducing the voltage applied to said load device.

9. A method as in claim 8 wherein said circuit further comprises a disable transistor having its base coupled to said load device, its emitter coupled to said enable input terminal, and its collector coupled to a collector of said phase splitter transistor, wherein said step of disabling said current source of said data input circuit with placing a high impedance on said output terminal comprises the step of turning on said disable transistor.

10. A circuit comprising:
means for receiving a data input signal on a data input terminal;
means for receiving an enable input signal on an enable input terminal;
output circuit means for providing an output signal as a function of said data input signal and said enable input signal;
a current source responsive to said data input signal for controlling said output circuit means;
means for disabling said output circuit means to provide a high impedance on said output terminal, in response to the receipt of a disable signal on said enable input terminal; and
means for disabling said current source in response to the receipt of a disable signal on said enable input terminal.

11. A circuit as in claim 10 wherein said output circuit means comprises an output pull up transistor and an output pull down transistor, and a phase splitter transistor for controlling the operation of said output pull up and output pull down transistors in response to input signals received on said data input terminal and said enable input terminal.

12. A circuit as in claim 11 wherein said means for disabling said output circuit comprises means for disabling said phase splitter transistor such that said output pull up and output pull down transistors are turned off.

13. A circuit as in claim 10 wherein said current source comprises a load device and a current source transistor for mirroring the current in said load device, and wherein said means for disabling said current source comprises means for reducing the current through said load device.

14. A circuit as in claim 13 wherein said means for reducing the current through said load device comprises means for reducing the voltage applied to said load device.

15. A circuit as in claim 14 wherein said means for disabling said output circuit and said means for disabling said current source further comprise a disable transistor having a base coupled to said load device, an emitter coupled to said enable input terminal, and a collector coupled to a collector of said phase splitter transistor.

16. A circuit as in claim 5 wherein said disabling of said current source of said data input circuit occurs substantially concurrently with said disabling of said pull-up means and said pull-down means.

17. A circuit as in claim 5 wherein said disabling of said current source of said data input circuit occurs substantially concurrently with said placing of a high impedance on said output terminal.

18. A method as in claim 9 wherein said step of disabling said current source of said data input circuit occurs substantially concurrently with said turning on of said disabled transistor.

19. A circuit as in claim 15 wherein said disabling of said current source occurs substantially concurrently with said disabling of said output circuit.

* * * * *